United States Patent [19]
Miyauchi et al.

[11] Patent Number: 5,539,976
[45] Date of Patent: Jul. 30, 1996

[54] SYSTEM FOR MANUFACTURE OF HYBRID INTEGRATED CIRCUIT

[75] Inventors: Kazuo Miyauchi, Kanagawa; Kazuya Sunami, Saitama; Kohei Mandai; Takako Higuchi, both of Tokyo, all of Japan

[73] Assignee: Sony Corporation, Tokyo, Japan

[21] Appl. No.: 259,346

[22] Filed: Jun. 14, 1994

Related U.S. Application Data

[63] Continuation of Ser. No. 22,764, Feb. 25, 1993, abandoned, which is a continuation of Ser. No. 715,644, Jun. 14, 1991, abandoned.

[30] Foreign Application Priority Data

Jun. 21, 1990 [JP] Japan ................................ 2-164571

[51] Int. Cl.$^6$ .................................................. H05K 3/30
[52] U.S. Cl. .................... 29/740; 29/705; 29/714; 29/721; 29/741; 29/840; 364/490
[58] Field of Search .................................. 364/489, 490, 364/491; 29/705, 720, 721, 740, 741, 743, 833, 832, 837, 840, 714–719

[56] References Cited

U.S. PATENT DOCUMENTS

| 3,094,212 | 6/1963 | Moore et al. | 364/489 X |
| 4,284,872 | 8/1981 | Graeme | 219/121 LJ |
| 4,667,403 | 5/1987 | Edinger et al. | 29/840 |
| 4,853,628 | 8/1989 | Gouldsberry et al. | 324/158 R |
| 5,018,936 | 5/1991 | Izumi et al. | 29/721 X |
| 5,353,234 | 10/1994 | Takigami | 364/489 |

FOREIGN PATENT DOCUMENTS

| 817635 | 8/1959 | United Kingdom . |
| 2182207 | 5/1987 | United Kingdom | H05K 1/18 |
| 2228619 | 8/1990 | United Kingdom | H01L 21/66 |

Primary Examiner—Carl E. Hall
Attorney, Agent, or Firm—Jay H. Maioli

[57] ABSTRACT

A system for manufacturing a hybrid integrated circuit by mounting an IC and a chip component on a circuit substrate. The system comprises a bar code reader for reading the characteristic data of each IC shown previously thereon to indicate the characteristic thereof, and a selector for selecting an optimal chip component in accordance with the read characteristic of the IC, thereby achieving manufacture of a satisfactory hybrid integrated circuit having predetermined performance.

2 Claims, 4 Drawing Sheets

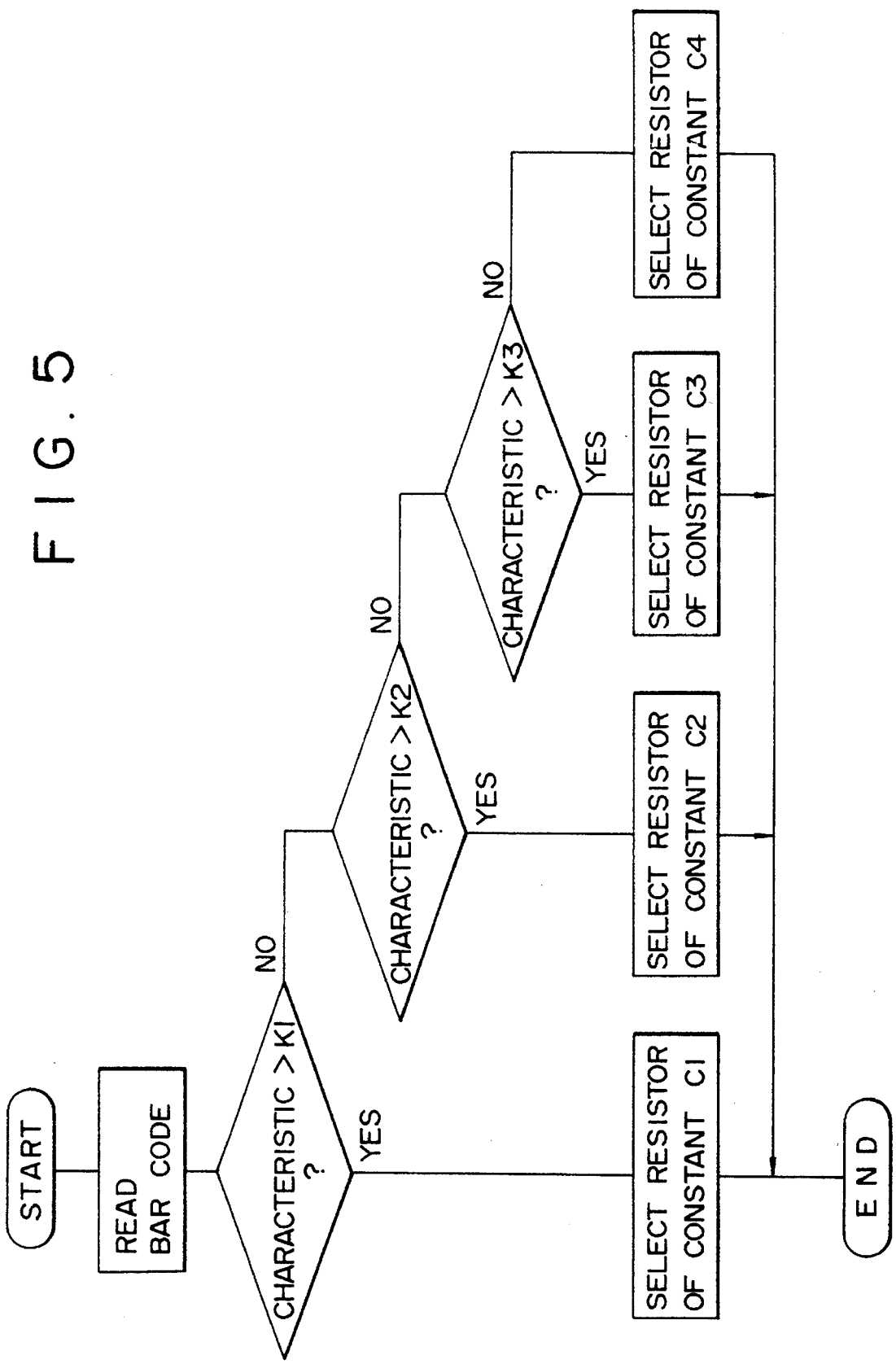

5,539,976

SYSTEM FOR MANUFACTURE OF HYBRID INTEGRATED CIRCUIT

This application is a continuation of application Ser. No. 08/022,764 filed Feb. 25, 1993, now abandoned, which is a continuation of application Ser. No. 07/715,644 filed Jun. 14, 1991, now abandoned.

BACKGROUND OF THE INVENTION

1. Field of the Invention

The present invention relates to a system for manufacture of a hybrid integrated circuit and, more particularly, to a system for manufacturing a hybrid integrated Circuit by mounting an IC (i.e., an integrated circuit) and a chip component on a circuit substrate.

2. Description of the Prior Art

It is generally customary that circuit components such as transistors, diodes, resistors, capacitors and so forth are previously checked with regard to the characteristics thereof and are classified into lots in conformity with the characteristics. Such circuit components are packed or taped and shipped in the state classified as mentioned. Therefore the characteristics of such circuit components can be discriminated by the indications shown on individual lots.

In a hybrid integrated circuit produced by mounting an IC and such components on a print substrate, a desired circuit for a predetermined operation is formed by connecting the components to the IC. However, due to the existence of characteristic variations in the individual ICs, it is not exactly possible to achieve predetermined uniform operations in the entire products if external components of predetermined characteristics are connected, and consequently there arises some problems including that the cutoff frequencies of filters composed of hybrid integrated circuits are prone to have variations.

OBJECT AND SUMMARY OF THE INVENTION

It is therefore an object of the present invention to provide a hybrid integrated circuit manufacturing system which is capable of attaining uniform characteristics in hybrid integrated circuits each produced by mounting an IC and a chip component on a print substrate.

According to one aspect of the present invention, there is provided a hybrid integrated circuit manufacturing system comprising a means for reading the characteristic data of each IC shown previously thereon, and a means for selecting a chip component, which is to be connected to the IC, in accordance with the IC characteristic read out by the reading means.

Thus, due to utilization of the characteristic data represented by a bar code or the like and given previously on each IC, it becomes possible to mount a chip component of selected characteristic on a substrate to thereby correct any variation in the IC, hence producing a satisfactory hybrid integrated circuit of predetermined performance.

The above and other features and advantages of the present invention will become apparent from the following description which will be given with reference to the illustrative accompanying drawings.

BRIEF DESCRIPTION OF THE DRAWINGS

FIG. 5 is a flow chart showing an operating procedure to execute a routine for selection of an external component to be connected to the IC.

DESCRIPTION OF THE PREFERRED EMBODIMENT

Hereinafter a preferred embodiment of the present invention will be described in detail with reference to the accompanying drawings.

Figure 1:
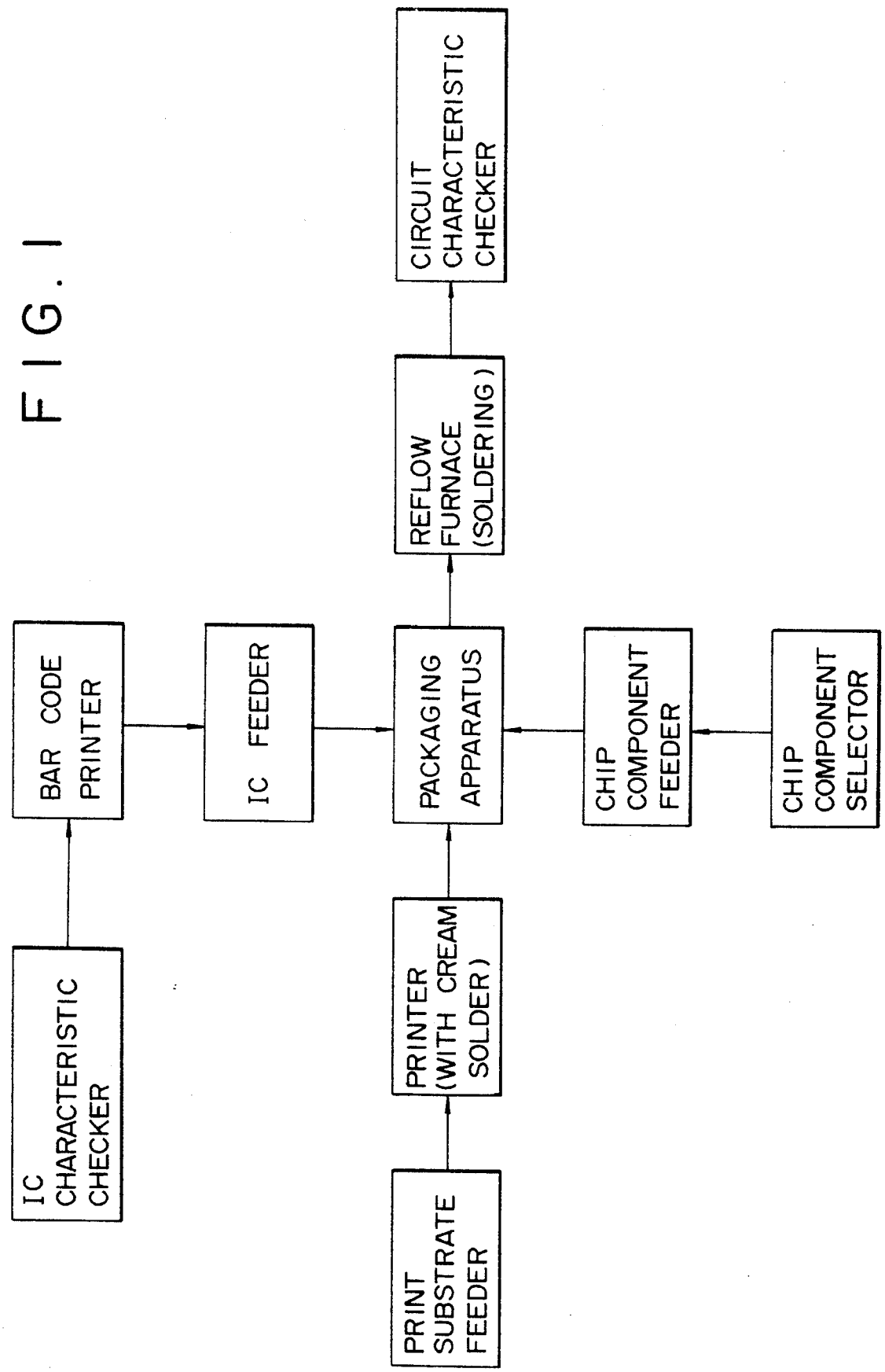
FIG. 1 is a block diagram of a hybrid integrated circuit manufacturing system embodying the present invention.

FIG. 1 is a schematic block diagram of a hybrid integrated circuit manufacturing system embodying the present invention. This system is equipped with a print feeder for feeding predetermined print substrates. First, a print substrate is supplied to a printer which coats the surface of the substrate with cream solder. Thereafter the print substrate is supplied to a packaging apparatus where both an IC and a chip component are mounted on the substrate. The circuit substrate with the IC and the chip component mounted thereon is supplied to a reflow furnace, where the cream solder is molten to solder the IC and the mounted component. The circuit substrate thus soldered is then checked with respect to the characteristic of the circuit, whereby an inspection is executed to discriminate between a satisfactory product and a defective one.

The ICs supplied to the packaging apparatus are checked in advance with respect to the characteristics thereof in an IC production process, and a bar code is printed on each IC in accordance with the result of such characteristic check. The packaging apparatus reads out such bar code and mounts the IC on a print substrate via an IC reader. Meanwhile, chip components forwarded to the packaging apparatus are selected by a chip component selector in accordance with the aforementioned IC characteristic, and the selected component is supplied via the feeder to the packaging apparatus so as to be mounted on the print substrate together with the IC.

Figure 2:
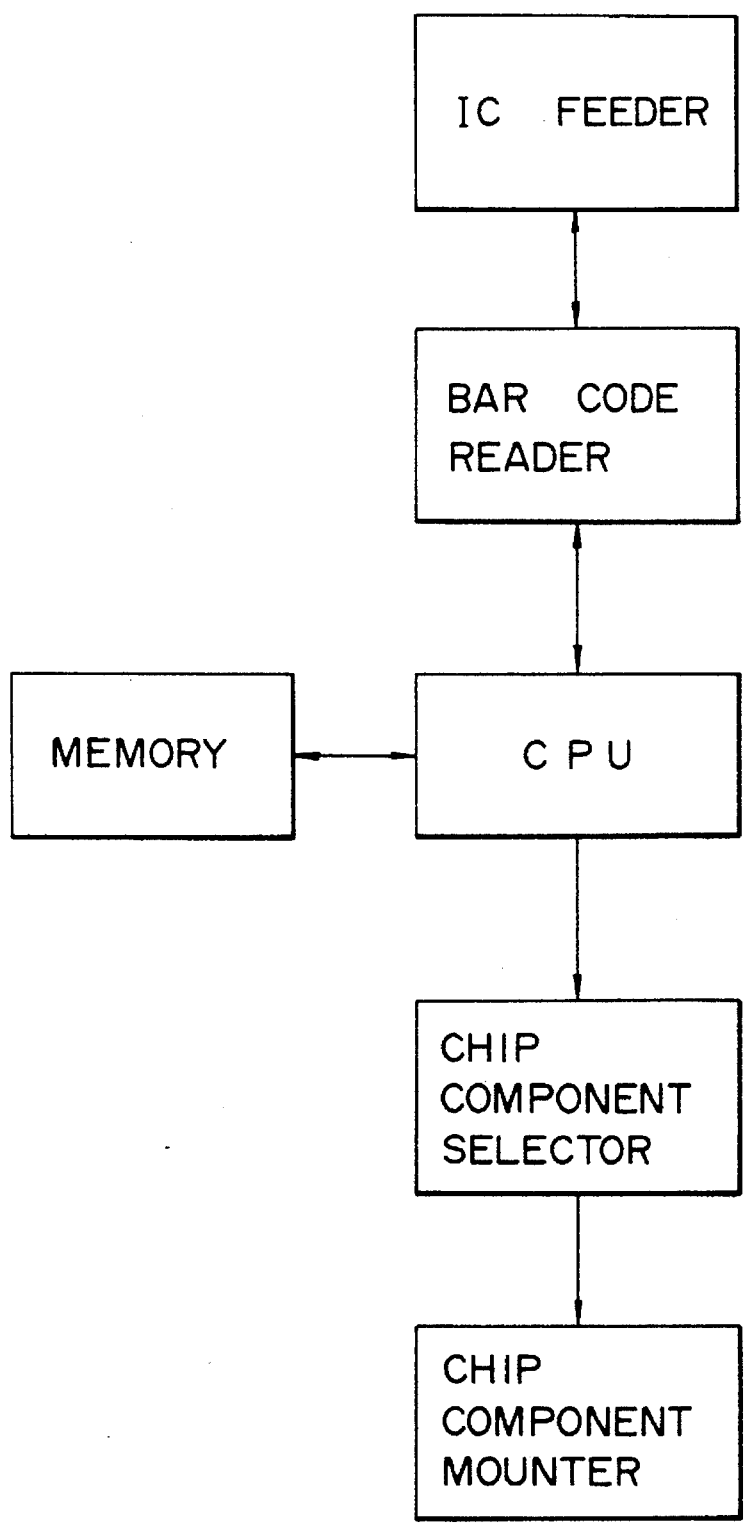
FIG. 2 is a block diagram of a chip component selecting mechanism in a packaging apparatus.

FIG. 2 is a block diagram of a chip component selecting mechanism employed in the packaging apparatus. A bar code reader is connected to a CPU (central processing unit) in the packaging apparatus and serves to read out the characteristic of each IC supplied from the IC feeder. Such IC characteristic is once stored in a memory via the CPU. Since the CPU is capable of driving the chip component selector in conformity with the IC characteristic, the selected chip component of an optimal constant can be mounted.

Figure 3:
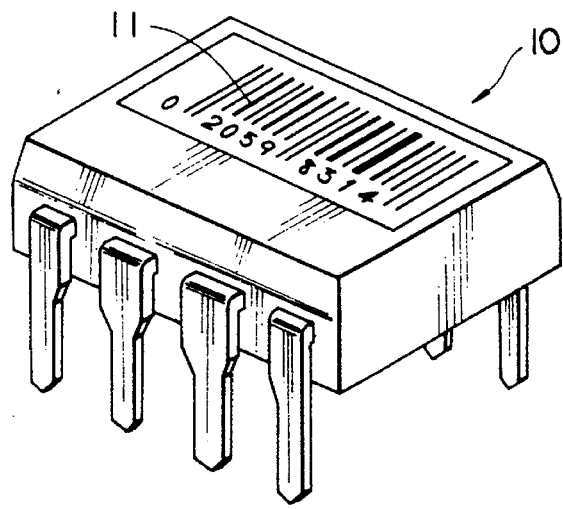
FIG. 3 is a perspective view of an IC with a bar code.

FIG. 3 illustrates an IC 10 used in such manufacturing system. On the package surface of each IC 10, there is given characteristic data 11 with a bar code.

Figure 4:
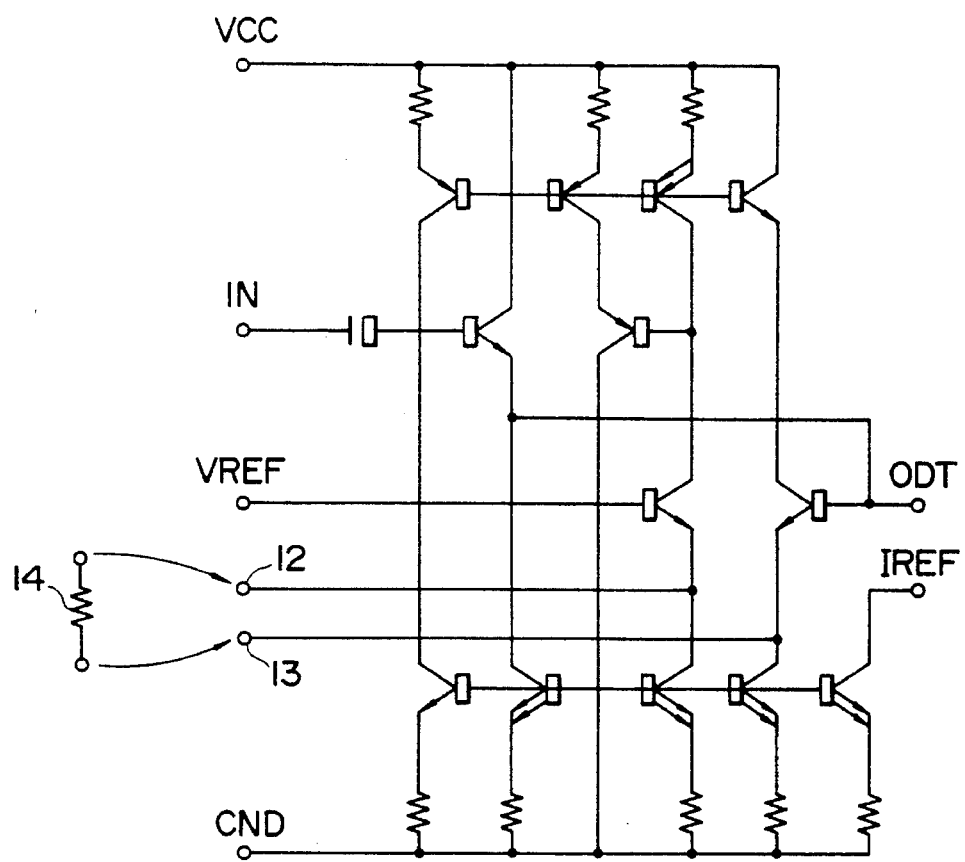
FIG. 4 is a circuit diagram of a high-pass filter composed of such IC.

FIG. 4 shows a circuit configuration of a high-pass filter composed of such IC 10, wherein a control resistor 14 is connected through terminals 12 and 13. And the resistance value of the resistor 14 is selected in accordance with the bar code 11 shown on the IC 10.

FIG. 5 is a flow chart of an operating procedure executed in the CPU to select such control resistor 14. First the bar code is read by the CPU via the bar code reader and, when the characteristic is greater than K1, a control resistor of a constant C1 is selected. In case the characteristic read from the bar code is greater than K2, a resistor 14 of a constant C2 is selected. Furthermore, if the IC characteristic read from the bar code is greater than K3, a control resistor of a constant C3 is selected. Meanwhile, when the characteristic of the IC 10 is smaller than K3, a resistor of a constant C4 is selected.

Generally in the mass production process, there occur variations in the characteristics of ICs, but such characteristic variations can be corrected by the selective use of external components to be connected thereto. First, in an inspection step executed in an IC production plant, the characteristics are inspected by an IC checker, and a bar code 11 is printed on a package or a bare chip of each IC 10. When the IC is mounted on a print substrate by a packaging apparatus in the aforementioned manufacturing system, the characteristic data of the IC 10 is read by the bar code reader, and an adequate external component is selected in accordance with such characteristic data. Consequently, any of the hybrid integrated circuits thus produced has a predetermined capability to perform a desired operation.

In the manner mentioned, the characteristic variations induced in the mass production of ICs 10 are controlled by utilizing the bar code 11, and when each of such ICs is mounted on a print substrate, an optimal external component adequate thereto is selected in conformity with the characteristic read out by a bar code reader. Accordingly, the ICs can be mounted together with chip components by a packaging apparatus without the necessity of being classified by the characteristic variations thereof, hence ensuring manufacture of satisfactory hybrid integrated circuits having predetermined uniform performance.

According to the present invention, as described hereinabove, characteristic data indicated previously on each IC is read out therefrom, and a chip component to be connected thereto is selected in conformity with the characteristic variation thus obtained from the IC. As a result, the characteristic variation of the IC can be corrected by the selected chip component to consequently attain predetermined performance in the manufactured hybrid integrated circuit.

What is claimed is:

1. A system for manufacturing a hybrid integrated circuit by mounting on a circuit substrate (i) an IC selected from a plurality of ICs from one to another of which there occur variations in characteristic electronic data, each individual IC of said plurality of ICs being respectively labeled with characteristic electronic data corresponding to said individual IC, and (ii) a chip component selected from a plurality of chip components, said system comprising:

reading means for reading said characteristic electronic data of a selected IC of said plurality of ICs; and selecting means responsive to said reading means for effecting a selection of a chip component for connection to said selected IC, said selection being made from said plurality of chip components that are of the same type but from one to another of which there occur variations in characteristic electronic data, and said selection being such that said selected chip component corrects electronically for a variation in characteristic electronic data of said selected IC from predetermined electronic data criteria.

2. A system according to claim 1 wherein the characteristic data of said selected IC is represented by a bar code and said reading means comprises a bar code reader.

* * * * *